United States Patent [19]

Wignot et al.

[11] Patent Number: 4,897,624
[45] Date of Patent: Jan. 30, 1990

[54] UNITARY CAPACITANCE TRIMMER

[75] Inventors: Leroy S. Wignot; Robert P. Parker, both of Indianapolis, Ind.

[73] Assignee: Thomson Consumer Electronics, Inc., Indianapolis, Ind.

[21] Appl. No.: 320,257

[22] Filed: Feb. 23, 1989

[51] Int. Cl.$^4$ .............................................. H03J 3/20
[52] U.S. Cl. ...................................... 334/80; 334/82; 361/405
[58] Field of Search ........................ 334/71, 78, 80, 82; 361/277, 278, 287, 400, 404, 405, 408; 455/173, 192, 334

[56] References Cited

U.S. PATENT DOCUMENTS

| | | | |
|---|---|---|---|
| 2,143,658 | 1/1939 | Morris et al. | 334/80 X |
| 2,860,249 | 11/1958 | Merriam | 334/80 X |
| 2,880,400 | 3/1959 | Tollefson | 336/20 |
| 2,902,629 | 9/1959 | Little et al. | 361/405 |
| 3,422,379 | 1/1969 | Granqvist . | |
| 3,693,052 | 9/1972 | Galanti | 361/405 |
| 3,747,045 | 7/1973 | Stross | 361/405 X |
| 3,806,844 | 4/1974 | Buckley et al. | 334/15 |
| 4,048,597 | 9/1977 | Knight et al. | 334/15 |
| 4,128,821 | 12/1978 | Kato et al. | 334/51 |
| 4,467,393 | 8/1984 | Kupfer | 334/80 X |
| 4,485,382 | 11/1984 | Moore | 340/825.69 |
| 4,567,523 | 1/1986 | Hiday et al. | 358/191.1 |
| 4,619,001 | 10/1986 | Kane | 455/192 |
| 4,677,396 | 6/1987 | Cruz et al. | 331/117 R |
| 4,818,823 | 4/1989 | Bradley | 361/405 X |
| 4,827,611 | 5/1989 | Pai et al. | 361/405 X |

FOREIGN PATENT DOCUMENTS 2508702 9/1976 Fed. Rep. of Germany ...... 361/405

*Primary Examiner*—Paul Gensler
*Attorney, Agent, or Firm*—Joseph S. Tripoli; Peter M. Emanuel; Frederick A. Wein

[57] ABSTRACT

Apparatus for adjusting capacitance between an electronic component and external circuitry. The electronic component is unitarily provided with a plurality of conductive leads for connection to external circuitry with at least one of the leads being configured to provide integral means for adjustment of capacitance. The configured lead is bent for a turnabout of about 180 degree change of direction such that when the component is mounted on a printed circuit board the portion of the lead distal of the component extends above the board and is positionally adjustable providing adjustable capactive coupling to other circuit components.

10 Claims, 2 Drawing Sheets

UNITARY CAPACITANCE TRIMMER

The present invention relates to the trimming of capacitance such as in the tuners of television sets or the like, and more particularly to a trimmer of capacitance, said trimmer being unitary with a component mounted onto a printed circuit board.

In high frequency tuner circuits of television sets, FM radios, VCR's, and the like, it is necessary to optimize particular circuits within each chassis, e.g., to slightly change or "trim" circuit parameters. The trimming of capacitance is also important in tuners which require tracking of the tuning of various sections, for example, the antenna filter, the local oscillator, and RF bandpass filter. In a like manner, for intermediate frequency (IF) circuits, trimmer capacitors can be used to tailor the shape of the bandpass (IF) circuits on each particular chassis.

Further, even in audio circuits with feedback, the high frequency response of the circuit can be adjusted using trimming capacitors in order to optimize response. This can be accomplished, by small adjustment of capacitance across a feedback resistor in order to tailor the response of the particular circuit in the particular chassis to optimize the transient response or adjust high frequency roll-off.

As the frequency of interest increases, the trimming of circuit components becomes more critical and difficult. For example, in the RF section of an FM tuner, or in UHF or VHF tuners of a television set, or VCR, very small changes of capacity can result in substantial changes in the resonant frequency of a tank circuit, or the like.

Component trimming, and particularly capacitance trimming, is necessary because of variations in circuit values during a production run. Component values have tolerances and inductors, resistors, and capacitors with very low tolerances, e.g., a ±5 percent tolerance, can be prohibitively expensive, particularly in a consumer product where competition requires striving for the lowest possible cost consistence with performance. In addition, high frequency coils can have a slightly different inductance, or stray capacitance between the turns, or to ground with just slight changes in their winding configuration or orientation. Furthermore, even though theoretically uniform printed circuit boards are used, in practice, there can be slight changes in the formulation of the dielectric material which can make a difference from set to set. Thus, it is not practical to build UHF and VHF tuners, or the like, without some production adjustment.

In tuners and the like, adjustment of component values is often accomplished by adjusting stray capacitance. Stray capacitance is the result of the location of a component relative to other electronic components and the chassis. The stray capacitance of a component to chassis ground or to some other component is a distributed capacitance (i.e., the sum of very large number of pont-to-point capacitors) and is a function of many things such as the orientation of the components, the route taken by printed circuit board conductors, and the distance of the particular component to other electrical components including chassis ground and grounded circuit board conductors. In RF circuits such adjustment or trimming of capacitance needs to be a very small amount, usually a fraction of a picofarad (pf). The trimming of stray capacitance is usually so small that it is impracticable to use a separate adjustable component for trimming circuit values.

The value of a capacitor, including a "stray capacitor", is a function of the area of the "plates" or the opposing surfaces of the capacitor, the distance between the plates, and the dielectric constant of the material disposed between plates. For stray capacitance, the dielectric material is air having a dielectric constant close to 1.0. As the spacing between capacitor plates is made smaller, the capacitance increases and as the spacing between the plates is made greater, the capacitance decreases.

Changing component orientation on a printed circuit board is usually not available for changing stray capacitance because the orientation is usually chosen for other reasons, e.g., minimizing circuit board area. More importantly, orientation is not adjustable from chassis to chassis. Obviously, there is no choice in the dielectric of a stray capacitor. Accordingly, the only avenue open to change stray capacitance is by changing the distance between the two effective plates forming the capacitor.

This choice of distance can be effectuated by selection of the relative positions (distance) between components and their orientations relative to each other (facing rather than orthogonal). Once this is determined, some adjustment can be made with lead dress, i.e. positional adjustment of the leads of a component towards or away from a ground surface and other components. For components mounted onto a printed circuit board, the lead dress or lead lengths are substantially fixed. This severely limits the ability to adjust stray capacitance.

In the case of terminals installed on a printed circuit board, the terminals are thick and rigid, and are rigidly staked to the board. Such terminals are unsuited for bending for capacitance trimming and if attempted to be used for such a purpose, may crack the board.

One approach which has been tried for trimming of capacitance is to insert a separate lead into an aperture of a printed circuit board which is also used to receive a component lead or into a separate aperture in a conductor "pad" electrically connected to the component lead. The separate lead is positionally adjusted with respect to a ground surface or to other components for changing the capacitive coupling to the associated component. This approach has proved not to be practicable inasmuch as the separate lead has no anchor orientation to hold its vertical position with respect to the printed circuit board or to stay installed on the board during assembly and soldering procedures. Accordingly, it is desirable to provide for an economical and reliable adjustment of capacitance for television tuners and the like during production.

SUMMARY OF THE INVENTION

Briefly, the present invention concerns apparatus for adjusting capacitance between external circuitry and an electronic component. Specifically, at least one of the leads of the component is configured to provide integral means for adjustment of capacitance. The configured lead is bent in a turnabout of approximately 180 degree change of direction such that when the component is mounted onto a printed circuit board or the like by the configured lead as well as at least one other lead, the bent portion of the lead distal of the component extends above the board and is positionally adjustable for providing capacitive coupling to other components and/or ground. The adjustment of capacitance is accomplished by an angular change of the position the lead portion away from an axis perpendicular to the board, and the directional or bearing position of the lead portion relative to the components and/or ground surface.

DESCRIPTION OF THE DRAWINGS

For better understanding of the present invention, reference may be had to the accompanying drawings wherein.

DETAILED DESCRIPTION OF THE PREFERRED EMBODIMENT

Figure 1:
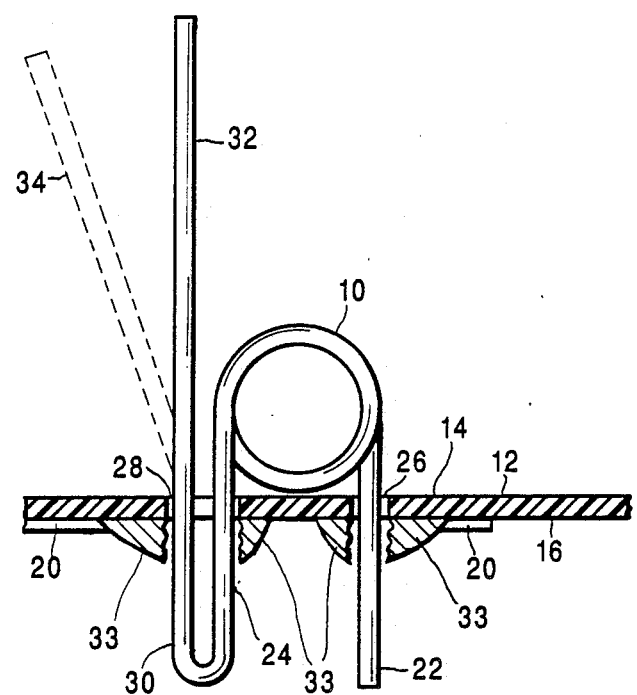
FIG. 1 is a diagrammatic representation of a coil component mounted on a printed circuit board according to an aspect of the present invention.

Referring now to the drawings wherein like reference numerals have been applied to like members, there is shown in FIG. 1 a coil (inductance) 10 which comprises a plurality of turns and is mounted on a printed circuit board 12 having an exemplary component mounting side 14, and an exemplary etched copper conductor side 16 having various printed circuit conductors 20 disposed thereon. The leads 22 and 24 of component 10 are unitary with and emanate from component 10 in a generally parallel relationship and are inserted through apertures 26 and 28 respectively. Coil 10 is secured to and electrically connected to printed circuit board 12 by solder 33, usually accomplished by a wave soldering procedure.

As shown in FIG. 1, at least one of the leads, in the exemplary embodiment, lead 24, has an integral extension portion thereof 30 bent back onto itself with about 180 degrees change of direction. The integral extension 30 extends back through aperture 28 and further extends outwardly from printed circuit board surface 14 forming an extended distal portion or leg 32. As shown, distal portion 32 extends generally perpendicular to surface 14, is secured at portion 30 by solder pad 33 and is unsecured at the other end of leg 32.

Distal portion 32 of lead portion 30 is positionally adjustable as shown, by a representative phantom position 34, by being angularly bent with respect to the plane of board 12. The bending preferably occurs while one or more electrical characteristics of the circuit in which coil 10 is connected are being monitored and therefore is accomplished with a plastic or non-conductive probe so that the adjustment tool does not itself affect the test. Lead portion 32 when bent, can be brought close to or away from external circuitry and components (not shown), or a chassis ground surface, or a printed circuit conductor pad, which can be grounded. The more acute angle lead portion 32 makes with the plane of board 12, the closer the average distance of the portion 32 to adjacent board components or ground conductors, and the larger the distributed capacitance coupled to component 10 by way of lead 24. In this manner, the distributed capacitance to lead portion 32 can be adjusted or trimmed. This selective positioning of lead portion 32 with respect to a ground plane chassis, or other adjacent components permits adjustment of the particular circuit wherein component 10 functions.

The positioning of lead 32 can also be a bearing or directional position adjustment (not shown) as well as an angular adjustment shown in FIG. 1. In other words, lead 32, can be bent within ±90 degrees of perpendicular to board 12 and in any direction such as out from the plane of the paper of FIG. 1. Additionally, if appropriate, lead 22 can be similarly configured as is lead 24.

In the exemplary embodiment, the coil 10 is a one and a half turn inductance such that the leads 22 and 24 will emanate from component 10 in the same direction for connection to printed circuit board 12. It is within contemplation of the present invention that component 10 can be a resistor, or a capacitor, or an active component such as a transistor with a configured lead such as lead 24.

In the exemplary embodiment, leg 32 extends about 0.5 inch above the printed circuit board 12 and provides a range of capacitance adjustment of approximately 0.6 picofarad (pf). Where appropriate, the length of lead portion 32 can be shortened by cutting in order to further trim the coupling capacitance.

Leg 32 is shown as an extended portion of lead portion 30 which has a "U" shaped configuration with a change of lead direction of 180 degrees forming an elongated extension of lead 30. The term "U" shaped configuration used herein is intended to include configurations where the lead portions 30 and 24 are touching without any space therebetween.

Referring now to FIG. 2, there is shown some of the possible equivalent circuit configurations of tee component 10 shown in FIG. 1. FIG. 2a shows inductance 10 with capacitance C to ground provided by lead 32 being adjustable relative to grounded external components or chassis according to the angle and direction of bending. In such a situation lead 22 is grounded by an appropriate circuit board conductor 20 with lead 32 electrically connected to the high potential side of coil 10. Lead 32 in the upright position will introduce some small amount of capacitance which is negligible compared to the value of the stray capacitance provided by the the position of leg 32 after adjustment.

Figure 2A:
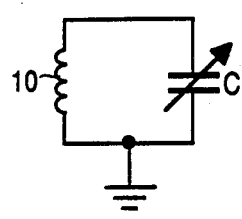
FIGS. 2a, b, and c and d are schematics of various configurations having adjustable capacitance as provided by the invention of FIG. 1.
Figure 2B:
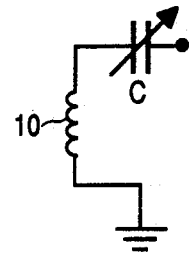

Referring now to FIG. 2b there is shown inductance 10 with stray capacitance C coupled to an adjacent component through a connection point. As with the circuit shown in FIG. 2a, leg 32 is electrically connected to high side lead 24 of inductor 10 with lead 22 being grounded by one of printed circuit conductors 20.

Figure 2C:
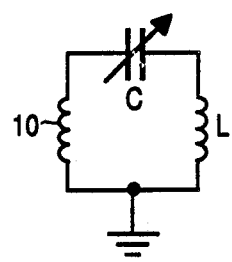

Referring now to FIG. 2c there is shown inductance 10 with capacitance C being provided by leg 32 with the capacity C coupling inductance 10 with an inductance L, another coil present on the printed circuit board in the vicinity, adjacent to, or in close proximity with inductance 10. As with FIGS. 2(a) and 2(b), inductance 10 is grounded on one side and inductance L is also grounded on one side (which need not be the case) and leg 32 is connected to the high potential side of coil 10.

Figure 2D:
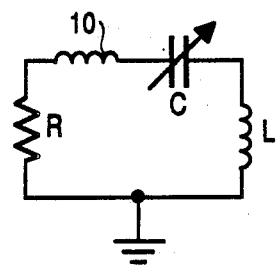

FIG. 2d shows the circuit of FIG. 2c with the low side (lead 22) of inductance 10 being coupled to ground through resistance R.

Figure 3:
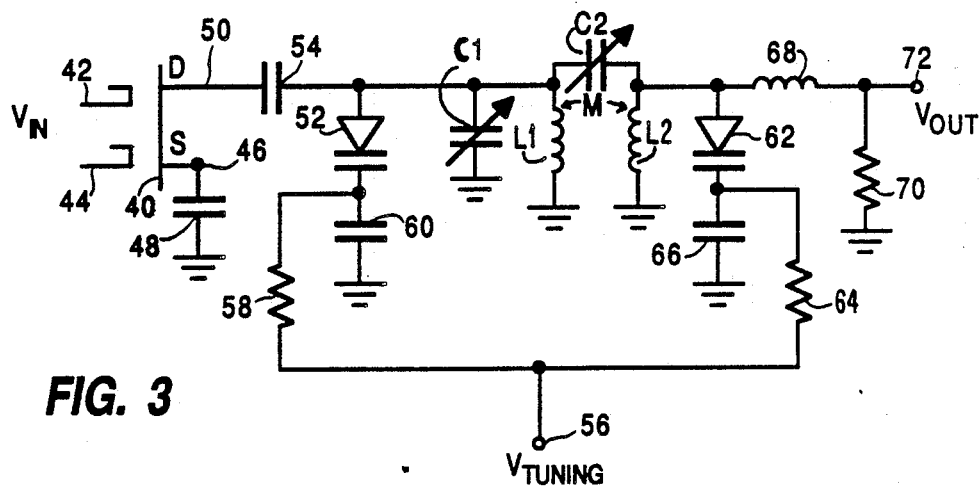
FIG. 3 is a schematic of a portion of a tuner useable in a television set or the like including aspects of the present invention of FIG. 1.

Referring now to FIG. 3, there is shown an exemplary portion of an RF tuner wherein capacitance provided according to the invention can be used to optimize the circuit. FET transistor 40 is a RF amplifier having a plurality of input gates 42, 44 and operating in a manner known in the art, i.e., signal is applied to gate 44 and AGC voltage applied to gate 42. Source 46 is coupled to AC ground through capacitor 48 (the DC circuit comprising a resistor is not shown). Drain 50 is AC coupled to varactor diode 52 through capacitor 54 (the DC circuit to a supply voltage is not shown) with the bias and hence the capacitance of varactor 52 being determined by the bias voltage applied to terminal 56 through isolation resistor 58 connected to the cathode of varactor 52. The cathode of varactor 52 is signal grounded through capacitor 60 and the DC return of the anode of varactor 52 is provided through a coil L1. Varactor 52 is placed across coil L1 for resonating with coil L1 at a predetermined frequency such as the picture carrier frequency of a television channel.

Coil L1 is the primary coil a double tuned tank circuit and is inductively coupled to a secondary coil L2 which in a like manner to the circuit of primary coil L1 is tuned by a varactor 62 having a variable capacitance according to the voltage applied to terminal 56 coupled to varactor 62 through isolation resistor 64. Also in a like manner to the circuit of primary coil L1, the cathode of varactor 62 is AC coupled to ground by capacitor 66 with the DC return of varactor 62 being provided by coil L2. The double tuned primary and secondary circuits are intended to track one another over a frequency range which the voltage applied to terminal 56 is intended to tune.

Coils L1 and L2 are inductively coupled by placement parallel and proximate to each other on the printed circuit board 12. The mutual coupling between the two coils L1 and L2 is adjustable by bending the coils towards or away from each other at a frequency lower than the resonant frequency.

In this exemplary embodiment, capacitor C1 provided by leg 32 attached to coil L1 (as shown in FIG. 1) provides capacitance as shown in FIG. 2a for trimming to resonate the tuned circuit comprising the primary coil L1 and varactor 52 to the same frequency as the tuned circuit comprising the secondary coil L2 and varactor 62. Thus, due to component tolerances, trimmer capacitance C1 is added across L1 for both tank circuits to resonant at the same frequency.

In a like manner, coil L2 can be constructed similar to coil L1 with its respective leg 32 (FIG. 1) adjustably providing capacitive coupling to proximate coil L1 for providing capacitance C2 between coil L1 and L2 as shown in FIG. 2c. The effect of capacitor C2 is to reduce the mutual inductance between coils L1 and L2 at higher frequencies where the "Q" of the tank circuit is higher and the corresponding bandwith would be reduced.

The signal output from the double tuned circuits including L1 and L2 is coupled through inductance 68 to load resistance 70 which is connected to ground. The output signal at terminal 72 across resistor 70 can be coupled to a mixer (not shown) or for further amplification through a succeeding amplification stage (not shown).

Thus, leg 32 integrally connected to a component lead and unitarily connected to an electronic component (as shown in FIG. 1) can be used for providing small amounts of adjustable capacitance to ground and to other components. Unitary capacitance trimmers disclosed herein can also be used in conjunction with other unitary capacitance trimmers of other proximate components, i.e., stray capacitance between a pair of unitary capacitance trimmers.

Thus there is disclosed an capacitive trimmer integral with the lead on an electronic component and unitary with the electronic component for providing adjustable stray capacitance coupling to said component mounted onto a printed circuit board. Additionally the configured lead also secures the component to the printed circuit board by providing a soldered electrical connection to appropriate printed circuit board conductors.

In a like manner, the electronic component by virtue of its secure mounting to the printed circuit board both before and after soldering, maintains the initial orientation position of leg 32 before adjustment (bending) thereof.

While there has been illustrated and described what is at present considered to be a preferred embodiment of the present invention, it will be appreciated that numerous changes and modifications are likely to occur to those skilled in the art and it is intended in the claims to cover all those changes and modifications which fall within the true spirit and scope of the present invention.

What is claimed is:

1. An electronic device comprising:
   an electronic component,
   at least two electrically conductive leads emanating from said component in respective predetermined directions for electrical coupling of said component to external circuitry, said leads being extendable in a first direction through apertures disposed in a printed circuit board for securing electrical connection of the component to printed circuit conductors disposed on a surface of the printed circuit board, at least one of said leads being bent back in approximately a 180 degree reversal of direction and having a lead portion extending in a second direction opposite to said first direction back through the respective aperture of the printed circuit board, said lead portion being unsecured above the printed circuit board and positionally adjustable with respect to the component for providing one plate of an adjustable capacitive coupling to an other element.

2. An electronic component comprising:
   an electronic component having leads for connection to external circuitry, one of the leads being bent back in an approximate reversal of direction and having a portion distal of the component, the distal portion being positionally adjustable with respect to the component for providing one plate of an adjustable capacitive coupling to an other element.

3. An electronic component having a plurality of leads with at least one of the leads having a portion configured in an approximate reversal of direction, the component being mountable by the leads and the configured portion onto a printed circuit board, an end of the configured lead distal of the component being unsecured above the board and positionally adjustable with respect to the component for providing one plate of an adjustable capacitive coupling to an other element.

4. A printed circuit board comprising:
   a printed circuit board having at least two apertures for receiving an electrical component, and
   an electronic component mounted onto the printed circuit board through said apertures, said electronic component having at least one lead configured in an approximate reversal of direction with the end of the configured lead distal of the component extending away from the printed circuit board, and being unsecured above the board and positionally adjustable with respect to the component for providing one plate of an adjustable capacitive coupling to an other element.

5. An electronic device comprising:
an electrically conductive lead extending from and above a component mounting surface of a printed circuit board, said lead being unsecured at a first end portion disposed above the board with the other end secured to the board and configured in an approximate reversal of direction continuing upwardly back through the board to an electronic component securely mounted on and electrically connected to the board and printed circuit conductors disposed on the board, the first end portion of the lead being positionally adjustable with respect to the component for providing one plate of an adjustable capacitive coupling to an other element.

6. A television receiver tuner comprising:
a printed circuit board having at least one aperture, and
an electronic component mounted on the printed circuit board, said electronic component having at least one lead configured so that it is bent back in an approximate reversal of direction extending back through the aperture with the end of the configured lead distal of the component extending away from and above the printed circuit board, and being positionally adjustable with respect to the component for providing one plate of an adjustable capacitive coupling to an other element.

7. The device of claim 6, wherein the electrical component is an inductance comprising at least 1.5 turns of wire.

8. A method for making a unitary capacitance trimmer comprising:
providing an electronic component having a lead extending outwardly from the component, and
configuring the lead so that it is bent back in an approximate reversal of direction for mounting the component by the configured lead onto a printed circuit board, the distal end of the lead being positionally adjustable with respect to the component for providing one plate of an adjustable capacitive coupling to an other element.

9. A method for making a unitary capacitance trimmer mounted onto a printed circuit board comprising:
providing a printed circuit board having at least one aperture,
providing an electronic component having a lead extending outwardly from the component,
configuring the lead so that it is bent back in an approximate reversal of direction, and
mounting the lead on the printed circuit board through said at least one aperture, the distal end of the lead being positionally adjustable with respect to the component for providing one plate of an adjustable capacitive coupling to an other element.

10. An electronic system for processing of video signals comprising:
means for processing video signals, said means comprising at least one printed circuit board having at least two apertures for receiving electronic components, and
an electronic component mounted onto the at least one printed circuit board through said apertures, said electronic component having at least one lead configured in an approximate reversal of direction with the end of the configured lead distal of the component extending away from the printed circuit board, and being unsecured above the board and positionally adjustable with respect to the component for providing one plate of an adjustable capacitive coupling to an other element.

* * * * *